United States Patent [19]

Foulke et al.

[11] Patent Number: 5,059,079
[45] Date of Patent: Oct. 22, 1991

[54] PARTICLE-FREE STORAGE FOR ARTICLES

[75] Inventors: Richard F. Foulke, Carlisle; Richard J. Keohane, Braintree, both of Mass.

[73] Assignee: Proconics International, Inc., Wilmington, Mass.

[21] Appl. No.: 481,749

[22] Filed: Feb. 15, 1990

Related U.S. Application Data

[63] Continuation of Ser. No. 353,191, May 16, 1989, abandoned, which is a continuation of Ser. No. 143,405, Jan. 13, 1988, abandoned.

[51] Int. Cl.$^5$ .............................................. B65G 1/133
[52] U.S. Cl. .................................. 414/275; 98/115.3; 294/907; 312/236; 414/277; 414/786; 901/35
[58] Field of Search ............... 414/217, 277, 280, 287, 414/273-275, 787, 331, 263, 283; 98/115.3; 312/236; 211/41, 194; 901/35, 47; 294/67.33, 907; 414/786

[56] References Cited

U.S. PATENT DOCUMENTS

| | | |
|---|---|---|
| 3,302,804 | 2/1967 | Harris ................... 414/283 |
| 3,703,801 | 11/1972 | Deckas ................ 98/115.3 X |
| 4,039,089 | 8/1977 | Kochanneck ........... 414/263 X |
| 4,089,322 | 5/1978 | Guibert ................. 312/236 X |
| 4,423,998 | 1/1984 | Inaba et al. ............ 294/907 X |
| 4,428,708 | 1/1984 | Burt ....................... 414/275 |
| 4,557,184 | 12/1985 | Orii et al. .............. 98/115.3 |
| 4,622,888 | 11/1986 | Denner et al. ........ 98/115.3 |
| 4,637,301 | 1/1987 | Shields ................. 98/115.3 |
| 4,649,830 | 3/1987 | Tanaka ................ 414/217 X |
| 4,701,096 | 10/1987 | Fisher, Jr. ............ 414/331 X |
| 4,714,399 | 12/1987 | Olson ................... 414/275 X |
| 4,766,322 | 8/1988 | Hashimoto ........... 414/273 X |
| 4,797,055 | 1/1989 | Tworoger et al. ........ 414/283 |
| 4,808,059 | 2/1989 | Eddy .................... 414/283 X |
| 4,867,629 | 9/1989 | Iwasawa et al. ....... 414/217 X |

FOREIGN PATENT DOCUMENTS

| | | |
|---|---|---|
| 1449961 | 9/1965 | France ................... 414/277 |
| 2589837 | 11/1985 | France ................... 414/280 |
| 20263 | 2/1978 | Japan ..................... 414/275 |
| 48309 | 5/1981 | Japan ..................... 414/274 |
| 56706 | 4/1985 | Japan ..................... 414/280 |
| 127502 | 6/1986 | Japan ..................... 414/277 |
| 155108 | 7/1986 | Japan ..................... 414/277 |

Primary Examiner—David A. Bucci
Attorney, Agent, or Firm—Fish & Richardson

[57] ABSTRACT

Apparatus for storing articles including walls defining a bin enclosure having an opening for transporting articles therethrough, a support for supporting articles in an article storage region in the enclosure, and a source of pressurized particle-free air to the region to provide a higher pressure in the article storage region than outside of the enclosure. Also disclosed are an energy beam vision system that is carried by a transport system and interfaces with the walls and a controller that controls the transport mechanism in order to properly align the relative positions of the transport mechanism and the enclosure.

11 Claims, 4 Drawing Sheets

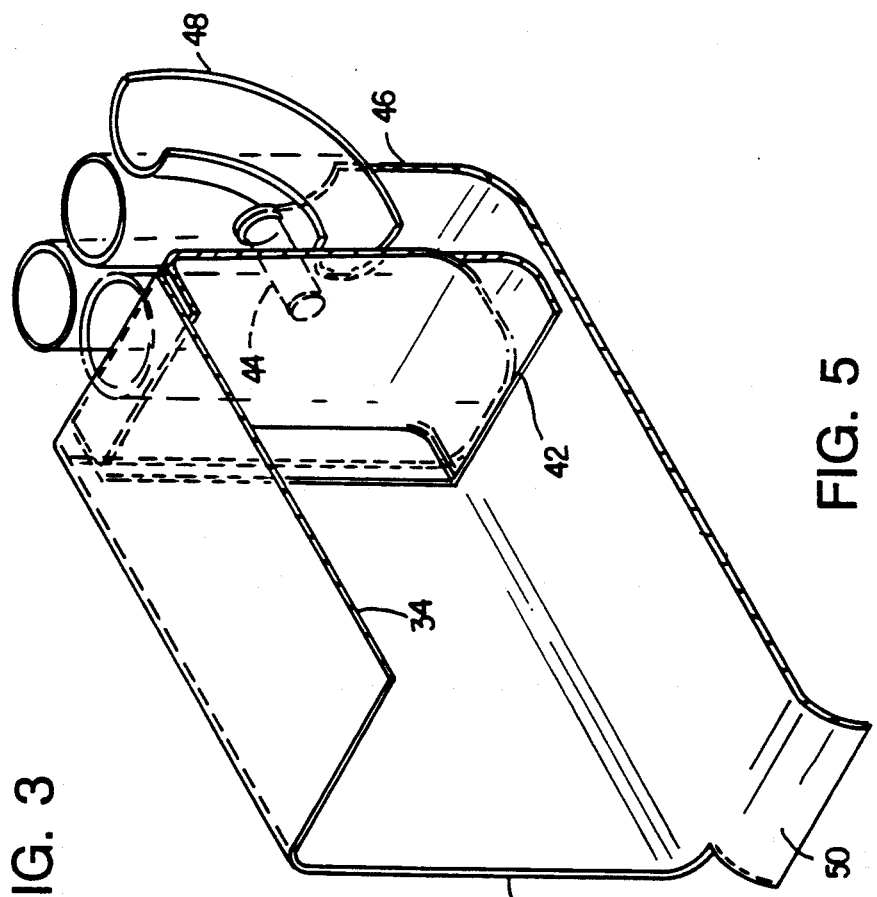
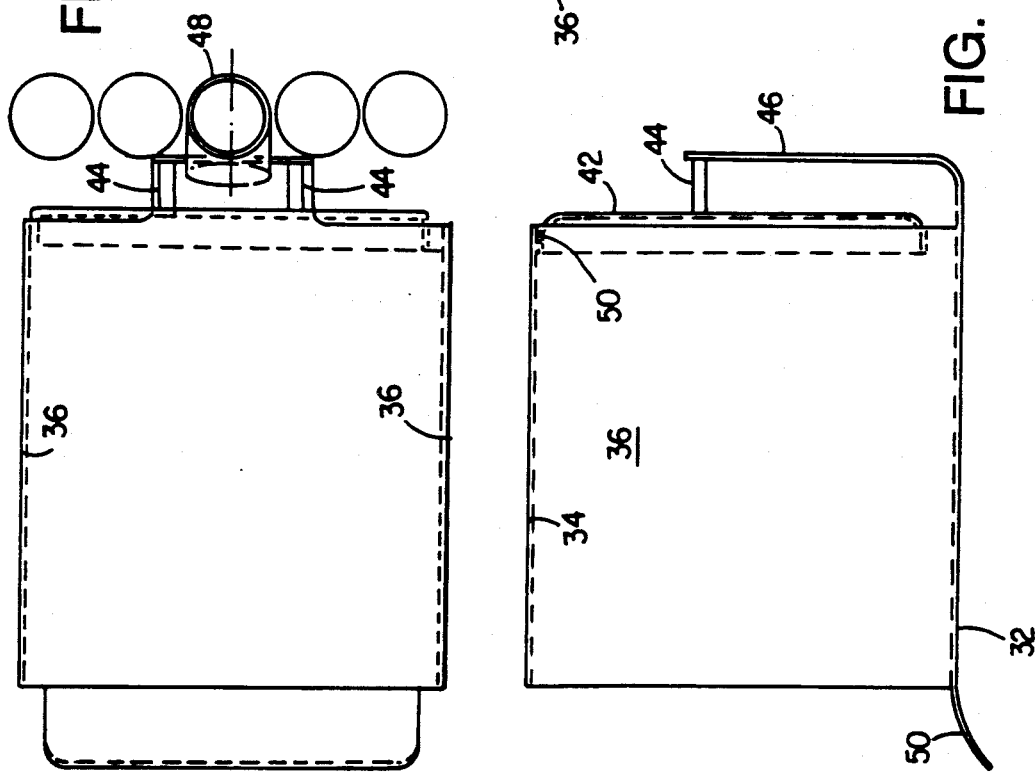
FIG. 3
FIG. 4
FIG. 5

PARTICLE-FREE STORAGE FOR ARTICLES

This application is a continuation of application Ser. No. 07/353,191 filed May 16, 1989, now abandoned, which is a continuation of application Ser. No. 07/143,405 filed Jan. 13, 1988, now abandoned.

BACKGROUND OF THE INVENTION

The invention relates to storage bins for articles, e.g., storage bins for semiconductor wafers carried by cassettes.

It is important to avoid particulate contamination of semiconductor wafers during manufacture when stored for a period of time between processing operations. Cassettes carrying semiconductor wafers have been stored in a room or under a hood in which there is a laminar flow of filtered air past the cassettes. Cassettes have also been stored in covered containers to prevent the entrance of potentially-contaminating air.

SUMMARY OF THE INVENTION

In one aspect our invention features in general a particle-free storage bin that has an open end to permit transfer of articles to and from an article storage region, a support for supporting the articles in the article storage region, and a source of pressurized, particle-free air directed to the bin to provide a higher pressure inside of the article storage region than outside of the bin. Particles are thus prevented from entering the article storage region without the need for moving or contacting parts (e.g., movable covers), which might themselves be sources of particles.

In preferred embodiments the pressurized air is directed to the regions at which there is contact of components during transfer of articles to the region in order to dispel any particles generated by contact; a plurality of articles are carried by a carrier that is supported on the support, and the air is directed past the bottom of the carrier above the support; the air is also directed past a region where an automatic transport mechanism makes contact with the carrier; there are a plurality of storage bins arranged in a vertical row, and a vertical laminar flow is directed across the fronts of all storage bins; at the fronts of the bins, there are downwardly directed lips to facilitate the downward laminar flow; at the back of each storage bin, there is a buffer plate against which air is directed from a source of air, and the air flows around curved edge portions of the buffer plate; and the air for each bin is provided by a separate supply tube that has no sharp corners to guarantee adequate flow to each bin and avoid dead spots at which particles could collect.

In another aspect the invention features in general article storage apparatus that includes one or more storage bins for receiving the articles and a transport mechanism for carrying the articles to and from the bins. The transport mechanism includes an energy beam vision system capable of interfacing with each storage bin in order to properly align the relative positions of the two.

In preferred embodiments a reflective surface is supported by each storage bin, and a light source and detector are carried by the transport mechanism; the transport mechanism includes two transport arms that include a second vision system that passes an energy beam between the arms to detect the presence of objects between the arms.

Other advantages and features of the invention are within the scope of the following claims.

DESCRIPTION OF THE PREFERRED EMBODIMENT

The preferred embodiment will now be described.

DRAWINGS

FIG. 3 is a plan view of the FIG. 2 storage bin.

FIG. 4 is a side elevation of the FIG. 2 storage bin.

FIG. 5 is a perspective view, partially broken away, of the FIG. 2 storage bin.

STRUCTURE

Figure 1:
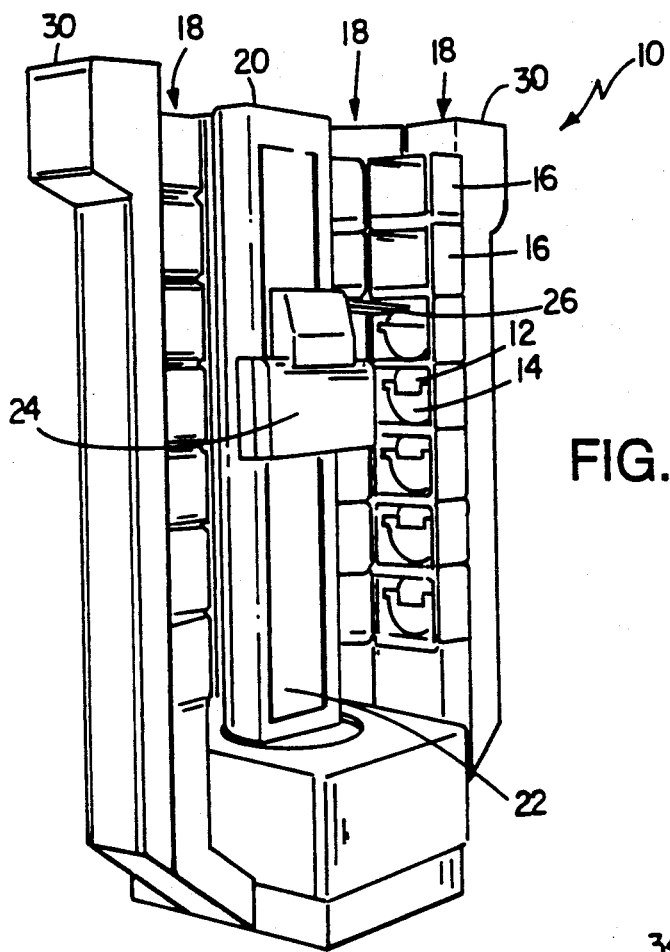
FIG. 1 is a perspective view of a cassette storage system according to the invention.
Figure 2:
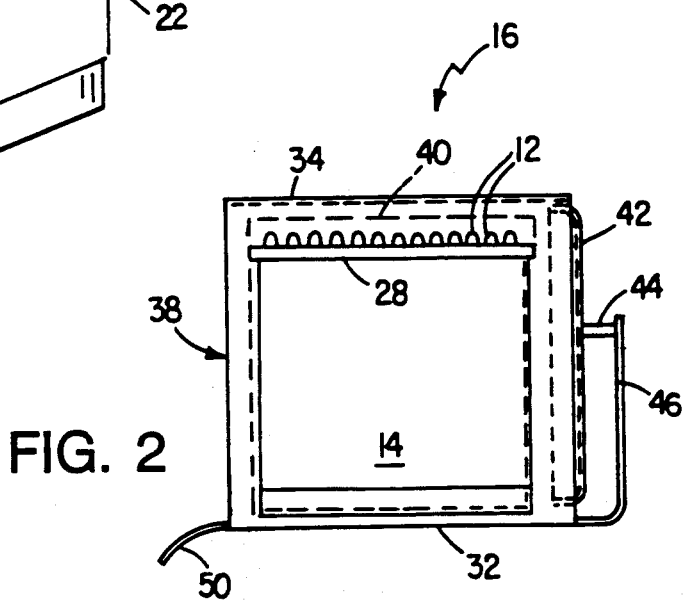
FIG. 2 is a diagrammatic vertical sectional view of a storage bin of the FIG. 1 system.
Figure 8:
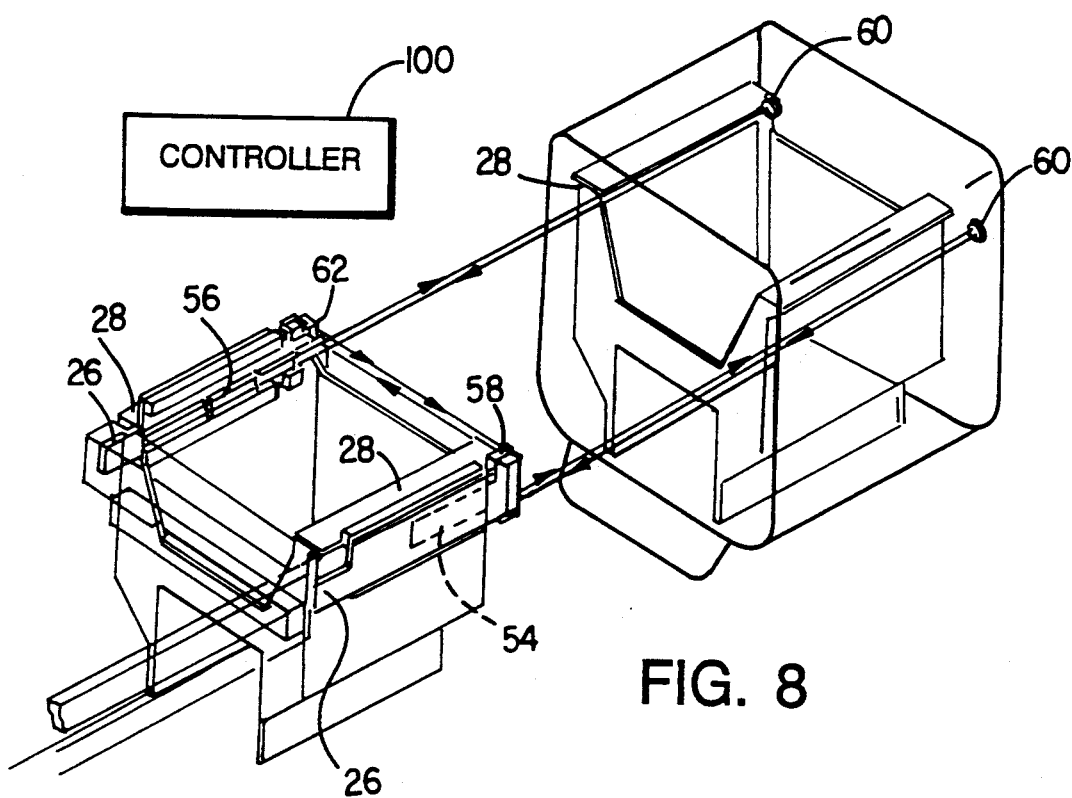
FIG. 8 is a diagrammatic perspective view of a transport mechanism and storage bin of the FIG. 1 system.

Referring to FIG. 1, there is shown storage system 10 for storing semiconductor wafers 12 in cassettes 14 in storage bins 16. System 10 includes a plurality of vertical rows 18 of storage bins 16, each of which can be accessed by transport mechanism 20, including rotatable elevator 22 on which carriage 24 is mounted for vertical movement. Carriage 24 carries horizontally movable transport arms 26 for engaging cassettes 14 under side lips 28 of cassettes 14 (FIG. 8). Each vertical row 18 of storage bins 16 includes a source of pressurized, particle-free air directed through a respective vertical distribution system 30.

Referring to FIGS. 2–5, each storage bin 16 is generally box-shaped and includes floor 32, ceiling 34, and side walls 36. There is an opening 38 at the front of the bin through which a cassette 14 travels when entering or leaving storage bin 16. Cassette 14 is supported on floor 32, and the wafers 12 within cassette 14 are within article storage region 40, as indicated on FIG. 2. Buffer plate 42 is provided at the rear of bin 16 and is supported by horizontal rods 44, mounted on vertical plate 46, connected to floor 32. Supply pipe 48 directs air to the rear of buffer plate 42 at its center, and is spaced from the back of buffer plate 42 by about 1". The top supply pipe 48 is 1.25" diameter; the next four are 1.5" diameter, and the last two are 1.75" diameter, to tend to reduce the restriction for the longer pipes. Side walls 36 are 8.0" wide and 7.75" high. Ceiling 34 is 8" wide and 7.0" deep. Lip 50 at the front of bin 16 extends outward from side walls 36 about 15/16" and has a radius of ⅞". Floor 32 is 11.5" from the end of lip 50 to vertical plate 46. Buffer plate 42 is spaced from floor 32 by 0.5", from ceiling 34 by 0.25", and from side walls 36 by 0.25". Buffer plate 42 includes curved edge portions extending forward 0.75" and having 0.5" radii of curvature at the top and bottom and smaller radii at the sides. Corners between side walls 36, ceiling 34, and floor 32 have ⅝" radii.

Figure 6:
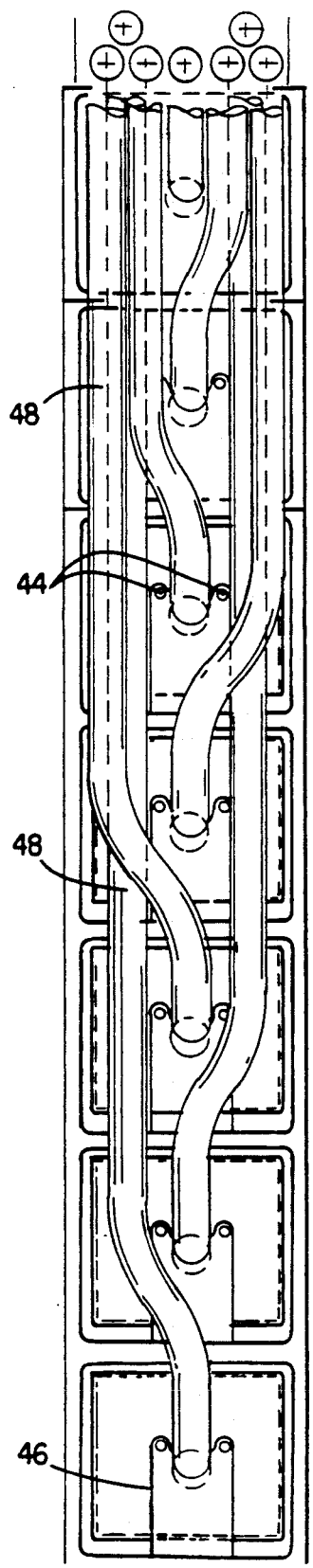
FIG. 6 is a rear elevation of a plurality of storage bins of the FIG. 1 system.
Figure 7:
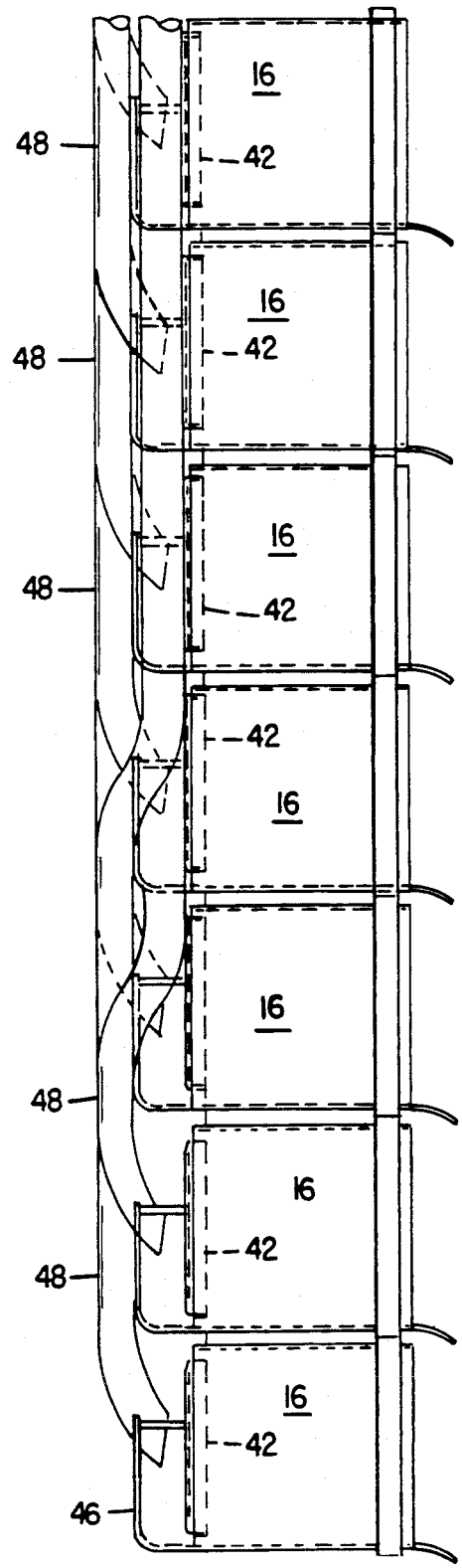
FIG. 7 is a side elevation of the FIG. 6 storage bins.

Referring to FIGS. 6 and 7, each storage bin 16 has a respective supply pipe 48 that provides a gently curving flow path without sharp joints to avoid dead flow areas at which particles could collect.

Referring to FIG. 8, transport arms 26 carry two longitudinal vision systems 54, 56 (one on each arm) and one transverse vision system 58. Each system 54, 56 includes a light beam source for directing a horizontal light beam into storage bin 16 and a light detector for detecting a beam reflected by small "point" mirror 60 mounted on the front of buffer plate 42. Transverse vision system 58 includes a light beam source for directing a horizontal beam to the other transport arm 26 and a light detector for detecting a beam reflected by mirror 62.

A computer generally indicated by controller 100 in FIG. 8 receives information from vision systems 54, 56, 58 and controls transport mechanism 20; the computer also keeps track of what cassettes are stored in what bins.

Operation

In use, storage system 10 receives cassettes 14 from a wafer transport or processing system (not shown) at a position within the reach of transport arms 26 and temporarily stores them in bins 16. In placing a cassette 14 into a bin 16, elevator 22 is rotated to the appropriate angle, and carriage 24 moves vertically to the appropriate position. Transport arms 26 are extended to carry cassette 14 into storage bin 16 and gently lower cassette 14 onto floor 32 to avoid scraping that might cause particle generation. Prior to traveling into a storage bin 16, vision systems 54, 56 verify that transport arms 26 are accurately aligned with storage bin 16, and final adjustments are made to place the cassette in the proper vertical and angular position. As transport arms 26 advance into bin 16, transverse vision system 58 checks to make sure that a cassette 14 is not already occupying bin 16; if the light beams between the ends of arms 26 are blocked, arms 26 stop, to avoid collision with the cassette occupying the bin. After cassette 14 has been gently lowered, transport arms 26 are retracted, and transverse vision system 58 senses blocking of its light beams as a function of position of arms 26 to determine if cassette 14 has been dragged to any extent after it has been dropped off. After retraction, vision systems 56, 58 are used to determine if a mirror 60 is blocked by the cassette, indicating that a cassette 14 has been tilted. The alignment is thus provided with only small reflectors 60 being located in the storage bins, avoiding moving components that could cause particles or dead flow spaces at which particles could collect.

Inside storage bins 16, filtered air from supply tube 48 passes around the curved edges of buffer plate 48 and proceeds as a gentle, laminar flow around the top, bottom, and sides of the enclosure. This causes the pressure to be higher in article storage region 40 than it is outside of storage bin 16 and causes laminar air flow past the regions where particulate generation might occur, namely where cassette 14 contacts floor 32 and where wafer transport arms 26 contact lips 28. The difference in pressure prevents any particles from entering article storage region 40. The flow of air past contact regions causes discharge of any particles that have been generated. A small, downward vertical laminar flow is provided (by means not shown) past the fronts of all bins 16 in order to carry any particles directed out of bins 16 downward and to prevent them from entering a lower bin 16. Curved lips 50 facilitate this downward air movement. Air velocity is kept less than one or two feet per second in the bins to avoid turbulent flow. Individual supply tubes 48 are used in order to provide clean, particle-free, equal flow to each bin 16 regardless of distance to the bin from the supply at the top of distribution system 30 and to eliminate any opportunity for particles to collect.

Other Embodiments

Other embodiments of the invention are within the scope of the following claims.

What is claimed is:

1. Apparatus for storing articles comprising
   walls defining a bin enclosure having an opening for transporting articles therethrough,
   a support for supporting articles in an article storage region in said enclosure,
   a transport mechanism for transporting said articles into and out of said storage region, said transport mechanism having two arms that can engage said articles between them and are movable along an axis into and out of said storage region,
   an energy beam vision system carried by said transport mechanism that directs an energy beam along a path that is close to but spaced from an outer boundary of a properly located and oriented article in said article storage region, and
   means for determining if said beam is blocked by said article.

2. The apparatus of claim 1 wherein said vision system includes a light beam source and detector that are carried by said transport mechanism, and further comprising a reflector supported by a said wall.

3. The apparatus of claim 2 wherein said transport mechanism includes two arms for engaging an article-carrying carriers at its sides.

4. The apparatus of claim 3 wherein each said transport arm carries a said vision system, and there are two reflectors supported by a said wall.

5. The apparatus of claim 1 further comprising a source of particle-free air to said region to provide a higher pressure in said article storage region than outside of said enclosure.

6. The apparatus of claim 3 further comprising a plurality of said walls, supports, and sources of air to provide a plurality of said enclosures.

7. The apparatus of claim 6 wherein each said source of air includes a separate supply tube for each said enclosure.

8. The apparatus of claim 7 wherein said supply tubes are gently curving so as to avoid dead spaces.

9. Apparatus for storing articles comprising
   walls defining a bin enclosure having an opening for transporting articles therethrough,
   a support for supporting articles in an article storage region in said enclosure,
   a transport mechanism for transporting said articles into and out of said storage region, said transport mechanism having two arms that can engage said articles between them and are movable along an axis into and out of said storage region,
   a transverse vision system that is carried by said arms and passes an energy beam between the arms along a path that is transverse to said axis to detect the presence of objects between the arms, and
   means for sensing blocking of said beam as a function of position of said arms as said arms are removed from said storage region to determine if said article has been dragged after it has been dropped off.

10. A method of placing an article at a desired location and in a desired orientation on a support in an article storage region comprising
    engaging said article with a transport mechanism that has two arms that are spaced from each other and engage said article in the space between said arms, said arms carrying a transverse vision system that passes an energy beam along a path between the arms to detect the presence of objects between the arms, moving said transport mechanism and engaged article along an axis that is transverse to said path into a position over said desired location, disengaging said article so as to place it on said support, and retracting said transport mechanism along said path and simultaneously sensing blocking of said beam as a function of position of said arms to determine if said article has been dragged after it has been dropped off.

11. A method of placing an article at a desired location and in a desired orientation on a support in an article storage region comprising engaging said article with a transport mechanism that carries an energy beam vision system, moving said transport mechanism and engaged article into a position over said desired location, disengaging said article so as to place it on said support, retracting said transport mechanism, directing a beam of said energy beam vision system along a path that is close to but spaced from an outer boundary of a properly located and oriented article in said article storage region, and detecting whether said beam is intersected by said article, thereby indicating improper placement or orientation.

* * * * *

UNITED STATES PATENT AND TRADEMARK OFFICE
CERTIFICATE OF CORRECTION

PATENT NO. : 5,059,079

DATED : October 22, 1991

INVENTOR(S) : Richard F. Foulke, Richard J. Keohane

It is certified that error appears in the above-identified patent and that said Letters Patent is hereby corrected as shown below:

On the title page, Item [56]:

Please include Foulke et al. U.S. Patent No. 4,493,606 under the Cited References Signed and Sealed this Sixth Day of April, 1993

Attest:

STEPHEN G. KUNIN

*Attesting Officer*　　　　　*Acting Commissioner of Patents and Trademarks*